United States Patent [19]
Kohm

[11] Patent Number: 5,264,065
[45] Date of Patent: Nov. 23, 1993

[54] PRINTED CIRCUITS AND BASE MATERIALS HAVING LOW Z-AXIS THERMAL EXPANSION

[75] Inventor: Thomas S. Kohm, Huntington, N.Y.

[73] Assignee: AMP-AKZO Corporation, Newark, Del.

[21] Appl. No.: 698,848

[22] Filed: May 13, 1991

Related U.S. Application Data

[63] Continuation-in-part of Ser. No. 534,959, Jun. 8, 1990, abandoned.

[51] Int. Cl.$^5$ ............................................. C23C 26/00
[52] U.S. Cl. .................... 156/307.4; 427/96; 427/97; 427/98; 427/407.1
[58] Field of Search .................. 427/96, 407.1, 97, 98; 156/307.4

[56] References Cited

U.S. PATENT DOCUMENTS

| | | | |
|---|---|---|---|
| 3,546,009 | 12/1970 | Schneble, Jr. et al. | 106/128 |
| 3,546,011 | 12/1970 | Knorre et al. | 427/98 |
| 3,560,257 | 2/1971 | Schneble, Jr. et al. | 427/98 |
| 3,600,330 | 8/1971 | Schneble, Jr. et al. | 106/112 |
| 3,629,185 | 12/1971 | Schneble, Jr. et al. | 524/403 |
| 4,167,601 | 9/1979 | Beckenbaugh et al. | 427/97 |
| 4,287,253 | 9/1981 | Leech | 427/306 |
| 4,791,248 | 12/1988 | Oldenettel | 427/97 |
| 4,800,461 | 1/1989 | Dixon | 427/97 |
| 5,080,958 | 1/1992 | Patterson | 427/96 |

FOREIGN PATENT DOCUMENTS

| | | | |
|---|---|---|---|
| 460539 | 12/1991 | European Pat. Off. | 427/96 |
| 199643 | 12/1982 | Japan . | |
| 7044 | 1/1984 | Japan . | |
| 97633 | 4/1989 | Japan . | |
| 222950 | 9/1989 | Japan . | |
| 133436 | 5/1990 | Japan . | |
| 133437 | 5/1990 | Japan . | |
| 133438 | 5/1990 | Japan . | |
| 133439 | 5/1990 | Japan . | |
| 133440 | 5/1990 | Japan . | |
| 133441 | 5/1990 | Japan . | |
| 133442 | 5/1990 | Japan . | |
| 133443 | 5/1990 | Japan . | |
| 133444 | 5/1990 | Japan . | |
| 117912 | 8/1990 | Japan . | |

*Primary Examiner*—Shrive Beck
*Assistant Examiner*—V. Duong Dang
*Attorney, Agent, or Firm*—Morgan & Finnegan

[57] ABSTRACT

A base material for printed wiring boards is formed by laminating together layers of prepregs of woven cloth impregnated with a thermosetting polymeric resin varnish. The varnish has an inorganic filler which is present in an amount sufficient to provide the base material with an average coefficient of thermal expansion along its Z-axis between 30° C. and 270° C. which is equal to or less than the coefficient of thermal expansion of copper from 30° C. to 270° C. plus the maximum elongation at 270° C. of copper suitable for forming a conductive pattern on hole walls of printed wiring boards. Printed wiring boards manufactured on the base material by additive or subtractive processes are resistant to failure from thermal stress or thermal cycling.

13 Claims, No Drawings

PRINTED CIRCUITS AND BASE MATERIALS HAVING LOW Z-AXIS THERMAL EXPANSION

This application is a continuation-in-part of U.S. patent application Ser. No. 07/534,959 filed Jun. 8, 1990 now abandoned.

FIELD OF THE INVENTION

This invention relates to printed wiring boards which are resistant to failure by thermal stress and thermal cycling, improved methods for their manufacture, and improved, fiber reinforced, plastic, base materials useful for the manufacture of such printed wiring boards.

BACKGROUND OF THE INVENTION

Fiber reinforced, plastic base materials are widely used as insulating support for copper conductive patterns of printed wiring boards. Printed wiring boards are manufactured by subtractive and by additive processes. In subtractive processes, the conductive pattern is obtained by selective removal of unwanted portions of a conductive foil. In fully-additive processes, the entire thickness of electrically isolated conductors is built up by electroless metal deposition. Base materials are manufactured for fully-additive processes which contain a catalyst for electroless metal deposition supported on a clay filler. The FR-4 type, additive base material contains 12 parts of palladium catalyzed clay filler per hundred parts of epoxy resin.

Among the thermosetting polymers used as printed wiring base materials are phenolic, epoxy, polyimide, cyanate ester and bismaleimide triazine resins. In soldering operations, printed wiring boards experience temperature excursions from 20° C. to 300° C., which severely stress the metallic conductive pattern. Woven fiber reinforcements anisotropically restrict thermal expansion in the warp and woof directions, so that most of the expansion is along the Z-axis. Glass cloth is the common fiber reinforcement in printed wiring boards, but woven aramid fiber and woven quartz fiber reinforcement have been used to further reduce the thermal expansion in the warp and woof directions. This reduced X-axis and Y-axis expansion increases the thermal expansion in the Z-axis direction.

The thermal expansion along the Z-axis of the glass cloth reinforced epoxy laminates from room temperature to soldering temperature is typically 10 to 20 times greater than the thermal expansion of copper along the Z-axis. Between 30° and 270° C., conventional glass cloth reinforced epoxy laminates expand about 5% along the Z-axis while the copper on the wall of a plated-through hole expands only 0.4%. This imposes a severe stress on the copper in the plated-through holes. Copper on the walls of plated-through holes in thin base materials (less than 0.8 mm thick) usually withstands the stress. In thicker materials (e.g., 1.6-3.2 mm thick) the strain causes cracks or even complete breaks in the copper conductors of the plated-through holes.

High ductility copper deposits are required to reduce or prevent cracks and breaks in plated-through holes. Copper electroplating solutions that will provide copper deposits capable of 15-20% elongation are recommended in the manufacture of subtractive printed wiring boards with plated-through holes. If the ability to provide deposits with 15-20% elongation is maintained, the failure rate of the printed wiring boards is only about 0.2%. However, in the manufacturing environment such copper electroplating solutions are subject to frequent upsets where failure rates of plated-through holes go to 25-100%. For fully additive, printed wiring boards with plated-through holes, electroless copper plating solutions providing copper deposits capable of 6-10% elongation have been recommended. It also has proven to be difficult to maintain the capability to deposit copper with this high elongation in a daily manufacture of additive wiring boards.

Most polymer systems used in base materials for printed wiring boards undergo a change in the rate of thermal expansion at a glass transition temperature, $T_g$. The $T_g$ for standard epoxy base materials is 110-130° C.; for high $T_g$ epoxies, it is 140-175° C.; for bismaleimide triazines, it is 160° C.; for cyanate esters, it is 220-250° C., and for polyimides, it is 240-290° C. Below the $T_g$ the Z-axis coefficient of thermal expansion, CTE, is in the range of $50-100 \times 10^{-6}$/°C. Above the $T_g$ the Z-axis CTE is in the range of $200-300 \times 10^{-6}$/°C. It is possible to reduce the thermal stress by utilizing polymer systems with a higher $T_g$ which provide a lower average CTE over the temperature range of 30-270° C. Plated-through holes in glass cloth reinforced polyimide laminates with high $T_g$ have been shown to resist thermal stress cracking, while plated-through holes produced under the same conditions in glass reinforced epoxy laminates fail in thermal stress. These higher $T_g$ materials are more expensive, more difficult to process, especially in drilling and metallizing plated-through holes, and, with the exception of polyimides, have not clearly demonstrated reduced failures in plated-through holes under thermal stress.

In the prior art, the CTE along the Z-axis of a FR-4 epoxy glass base material has not been closely controlled. The typical CTE from 30° C. to 270° C. of FR-4 epoxy glass laminates has averaged about 260 ppm and has varied from 210 to 320 ppm. Likewise, the percent elongation of the copper deposited has been difficult to precisely control. Since the CTE above $T_g$ is approximately 400% greater than the CTE below $T_g$ these average CTEs decrease somewhat as the $T_g$ increases. Other factors that contribute to variable CTE along the Z-axis are type of glass cloth, the resin pickup on the glass cloth, and variation in the press cure cycle and position of the individual sheets of base material in the press or book. Experience has shown that while the variation of the CTE along the Z-axis within one production lot of base material has been relatively small, it has been as much as 60 ppm from lot to lot of presumably identical material.

Composite Epoxy Materials (CEM) are fiber reinforced laminates using two or more types of reinforcing material. CEM laminates have not been widely used. The total area of double sided, copper clad, CEM laminates consumed in 1990 was only 5% of FR-4, glass cloth reinforced epoxy laminate consumption. The most widely used Composite Epoxy Material is CEM-3. CEM-3 is made with two woven glass face sheets, a nonwoven glass core, and a flame resistant epoxy resin. Typical CEM-3 construction is 4-8 sheets of epoxy impregnated glass mat or glass paper with woven glass prepregs as face sheets on each side. Through holes in FR-4 laminates must be drilled, but CEM laminates are designed to be punchable so that holes can be formed by lower cost punching techniques. However punching of CEM-3 laminates has been difficult because die clearances must be maintained at 25-50 micrometers instead of the 50-75 micrometers normally used in printed wiring board fabrication. Also, the punches must be resharpened more frequently. CEM-3 laminates warp and twist properties, impact strength and flexural strength are inferior to those of FR-4 laminates. Since the glass paper layers used in CEM-3 have less dimensional stability than the woven glass cloth used in FR-4, CEM-3 has less stability in the X- and Y-axes and should have less expansion in the Z-axis than FR-4. Because of its deficiencies, CEM-3 has not been adequate for use in the high quality markets served by woven cloth laminates such as FR-4.

Japanese Laid Open Patent Application 222,950 of 1989 has the goal to improve the molding of CEM-3 laminates by reducing the known deficiencies of (1) laminates which are thinner at the edges and thicker in the middle, and (2) poor adhesion between the surface prepreg layers of woven glass and the intermediate prepreg layers of non-woven glass. It describes copper clad, CEM-3 laminates which are made with an epoxy varnish containing 10-250% by weight of needle-shaped, inorganic fillers such as wollastonite. The filler was added to reduce the "squeeze out" of resin near the edges while permitting use of more fluid resin in the non-woven prepregs for better layer to layer adhesion. The filler was optionally treated with a silane coupling agent.

Japanese Laid Open Patent Applications 199,643 of 1982 and 7,044 of 1984 propose methods to improve the deficiencies in punchability and the X- and Y-axis dimensional stability of CEM-3 laminates. They describe copper clad, CEM-3 laminates that contain 5-50% wollastonite or 5-50% potassium titanium oxide plus 1-30% other fillers. Even with the improved dimensional stability, these laminates had a CTE in the Z-axis of $180 \times 10^{-6}/°C$.

To overcome the poor punching qualities and moldability of CEM-3 laminates, copper clad, CEM-3 laminates described in Japanese Laid Open Patent Application 97,633 of 1989 contain a third sheet of woven glass in the center of the unwoven fiber reinforcement along with boehmite and/or gibbsite, aluminum hydroxide filler, 80-200% by weight based on the resin content and a high temperature bisphenol A novolac epoxy resin. These CEM-3 laminates are reported to have improved dimensional stability, solder resistivity and plated-through hole reliability compared to conventional CEM-3 laminates.

Japanese Laid Open Patent Application 120,330 of 1990 also describes copper clad, nonwoven glass fiber laminates where 50-75% by weight aluminum hydroxide filler is added to a mixed epoxy and phenolic resin varnish in order to overcome some of the deficiencies of CEM-3 with regard to punching and dimensional stability in the Y-axis.

Even with these proposed improvements the properties of the CEM-3 laminates still do not permit their substitution in the markets served by FR-4 laminates.

Conventional epoxy laminates contain epoxy resins having a tetrabromophenyl group to provide fire retardance. When the laminate is exposed to flame or high temperature, bromine is released, which retards burning. The brominated resin laminates are more difficult to process than non-fire retardant laminates made with epoxy resins without bromine. Japanese Patent Application 117,912 of 1990 proposes the addition of an aluminum hydroxide filler to a non-brominated epoxy resin in woven glass cloth reinforced laminates to make a fire retardant laminate. Since like brominated resins, aluminum hydroxide also decomposes at high temperatures (releasing water above 200° C.), it provides fire retardance. Fifty percent by weight filler was added to a varnish; woven glass cloth was impregnated with the varnish, and eight sheets laminated together to make a flame retardant laminate. The laminate was reported to have good soldering heat resistance and measling resistance. The disadvantage of aluminum hydroxide filler in the laminate is the decomposition of the filler at elevated temperatures which can affect Z-axis expansion.

Silane coupling agents and organosilicon chemicals are used to upgrade the physical and electrical properties of mineral and glass filled thermoplastic resin systems to values approaching or sometimes exceeding the unfilled resin. In thermosetting resins, silane coupling agents are applied to the woven glass cloth in FR-4 laminates to improve the bond between the epoxy resin and the woven glass cloth. Silane coupling agents also have been used on alumina trihydrate in epoxy molding compounds to improve the electrical properties of the molded part. However, silane coupling agents are subject to hydrolysis and are not suitable for base materials which will be subjected to prolonged exposure to alkaline solutions as in some printed wiring board processing procedures.

Titanate and zirconate coupling agents react with an inorganic filler to make it hydrophobic, organophilic and organofunctional. In thermoplastic systems, filled polymers containing titanate and zirconate treated fillers have lower melt viscosity and are more easily processed than filled polymers without coupling agents. In thermosetting epoxy moldings filled with milled aramid, moldings treated with titanate coupling agents had triple the flexural and impact strength compared to moldings without coupling agents. Likewise, epoxy systems filled with potassium titanate whiskers had improved impact strength when titanate coupling agents were used. However, the use of organotitanate and organozirconate coupling agents has not gained acceptance in printed wiring board base materials.

SUMMARY OF THE INVENTION

Objects of the Invention

An object of the invention is to provide a printed wiring board base material having a thermal expansion along the Z-axis from room temperature to soldering temperature equal to or less than the thermal expansion of copper plus the strain to the elastic limit of a copper deposit. It is an object of this invention to provide a method of producing base materials for printed wiring boards having a coefficient of thermal expansion along the Z-axis less than $140 \times 10^{-6}/°C$.

It also is an object of this invention to provide a method of producing printed wiring boards with greater resistance to thermal stress and thermal cycling than was available in similar, prior art, printed wiring boards.

It also is an object of this invention to provide an epoxy, glass cloth base material for printed wiring boards having low thermal expansion, and which does not lead to fractures or cracks in the copper on walls of plated-through holes during soldering.

A further object of this invention is to produce base materials for the manufacture of fully-additive, printed wiring boards which base materials have enhanced catalytic activity for electroless metal deposition.

A further object of this invention is to produce base materials for the manufacture of subtractive printed wiring boards which are pre-catalyzed for electroless metal deposition and have enhanced catalytic activity compared to prior art base materials.

Yet another object of this invention is to produce a base material for printed wiring boards which has low water absorption, and is resistant to attack by alkaline solutions such as alkaline, electroless, copper deposition solutions.

It is an additional object of this invention to provide printed wiring boards in which the walls of the plated-through holes will not crack when subjected to thermal stress.

Definitions

By elongation is meant the elongation of a copper deposit when measured by the IPC Test Method 2.4.18, "Tensile Strength and Elongation, Copper Foil", available from The Institute For Interconnecting And Packaging Electronic Circuits. The test procedure includes providing a test sample of copper foil having a thickness of 0.038±0.008 mm; preparing test specimens from the sample having a width of 12.70±0.25 mm and a length of 150 mm; marking a gauge length of 50±1 mm on the test specimen; placing the test specimen in a tensile testing machine and applying a strain at a rate of 5 mm/minute until the test specimen breaks. Percent elongation at fracture may be determined by fitting the ends of the fractured specimen together, measuring the distance between the gauge marks and dividing by the original gauge length.

By a CTE of ... ppm is meant a coefficient of thermal expansion of ... $\times 10^{-6}/°C$ By average CTE between 30° C. and 270° C. along the Z-axis is meant the change in thickness of a base material from 30° C. to 270° C. divided by the thickness of the base material at 30° C. Since most base materials pass through a glass transition point below the midpoint, 150° C., the average CTE between 30° C. and 270° C. is somewhat larger than the arithmetical average of the CTE below the glass transition point and the CTE above it.

By soldering temperature is meant the temperature at which discrete components are mass soldered to a printed wiring board. Soldering temperatures normally range from 220° to 300° C.

By thermal stress is meant the stress applied to a plated-through hole by exposing a printed wiring board to molten solder at 288° C. for 10 seconds.

By thermal stress test is meant the test described in ANSI/IPC-SD-320B, "Performance Specification For Rigid Single- and Double-Sided Printed Boards", paragraph 4.6.5.1, Table 27, Class 3. In this test, printed wiring boards are conditioned by drying to remove moisture, then a thermal stress is applied and the plated-through holes are microsectioned and examined for cracks. Passing the thermal stress test means no cracks are found in the holes.

By thermal cycling test is meant cycling a printed wiring board having plated-through holes from −65° C. to 125° C. and remaining thirty minutes at each temperature. Passing the thermal cycling test means that there was no substantial change in the resistance of a series of plated-through holes during 300 cycles.

By parts per hundred resin (phr) is meant a concentration of an ingredient in a base material wherein the weight of the ingredient is based on the total weight of polymer solids in the base material.

For a printed wiring board base material having a planar shape and a length and breath greatly exceeding its thickness, X- and Y-axes refer to the planar dimensions, length and breath, and properties associated with those dimensions. Z-axis refers to the dimension and properties of the base material which are perpendicular to its planar dimensions and properties which are associated with the thickness of the base material.

Expansion along the Z-axis and CTE along the Z-axis of a base material refer to an increase in the thickness of the base material and the linear coefficient of thermal expansion in the direction perpendicular to the planar dimensions of the base material.

Brief Description Of The Invention

This invention relates to an improved base material for printed wiring boards. The base material is formed by laminating together layers of prepregs of woven cloth impregnated with a thermosetting polymeric resin varnish. It has been discovered that the thermal expansion along the Z-axis of the base material may be regulated by controlling the amount of inorganic filler present therein. Thus, according to this invention, the varnish has an inorganic filler which is present in an amount sufficient to provide the base material with an average coefficient of thermal expansion along its Z-axis between 30° C. and 270° C. which is equal to or less than the coefficient of thermal expansion of copper from 30° C. to 270° C. plus the maximum elongation at 270° C. of copper suitable for forming a conductive pattern on hole walls of printed wiring boards. The inorganic filler is non-toxic, has a Moh hardness of less than 7, is essentially non-hygroscopic, and does not decompose or evolve water below 300° C.

This invention also relates to a base material for printed wiring boards which contains an organic polymer and an inorganic filler. The thermal expansion of the base material along its Z-axis between room temperature and soldering temperature is less than the sum of the thermal expansion and the elongation to fracture of the copper to be deposited in the plated-through holes, and preferably the Z-axis expansion is approximately equal to or less than the sum of the thermal expansion and the strain at the elastic limit of copper to be deposited in plated-through holes of the printed wiring boards. The thermal expansion of the base material is regulated by including a predetermined amount of the inorganic filler in the polymeric base material.

In one aspect of the invention, the inorganic filler is present in an amount sufficient to maintain the thermal expansion of the thickness of the base material, between room temperature and soldering temperatures, less than the sum of the thermal expansion of copper and the strain of a plated copper foil at the elastic limit.

In another aspect, this invention relates to a method of reducing the anisotropic thermal expansion of a woven fiber reinforced, polymeric base material in which the polymeric resin has a high isotropic thermal expansion by adding to the polymer from 30% up to 100% by weight of a reinforcing filler, the filler having a thermal expansion 75% to 95% less than the isotropic expansion of the polymer.

In another aspect, this invention relates to a base material for printed wiring boards having an average coefficient of thermal expansion between 30° C. and 270° C. of less than $140 \times 10^{-6}/°C.$, the coefficient of thermal expansion being in the direction perpendicular to the planar dimensions of the base material. The base material comprises (a) a thermosetting polymeric resin, (b) a woven cloth reinforcing material and (c) a particulate filler material. The filler material has a coefficient of thermal expansion at temperatures between 30° C. and 300° C. of less than $20 \times 10^{-6}/°C$. and is present in the base material in an amount sufficient to maintain the coefficient of thermal expansion between 30° C. and 270° C. of the base material along its Z-axis below $140 \times 10^{-6}/°C$.

Another aspect of the invention concerns an improved base material for printed wiring boards. The base material is a laminate comprised of a plurality of impregnated glass cloths. The impregnating varnish comprises an epoxy resin, a filler, an organotitanate and/or an organozirconate coupling agent, and a curing agent for the epoxy resin. The curing agent is capable of producing a cured base material capable of accepting electroless metal deposits free of voids caused by interaction of the curing agent with palladium catalysts for electroless deposition. The curing agent is selected from the group consisting of acids, acid anhydrides, phenolic resins and aromatic compounds having at least one hydroxy group on the aromatic ring and mixtures of such curing agents.

In another aspect, the invention comprises a base material for printed wiring boards having improved catalytic activity for electroless metal deposition. The base material comprises a polymeric resin composition having phenolic hydroxyl groups and at least 30% by weight of an inorganic silicate filler.

In yet another aspect, the invention comprises printed wiring boards having plated-through holes produced on the above base materials. The walls of the plated-through holes are plated with a copper deposit in which the sum of the thermal expansion and the strain at the elastic limit is approximately the same as the thermal expansion of the thickness of the base material.

Yet another aspect of the invention concerns a method of manufacturing printed wiring boards with plated-through holes capable of passing repetitive thermal stress tests. In this method, a base material is provided which has a coefficient of thermal expansion along the Z-axis which is no greater than the thermal expansion and the strain at the elastic limit of the copper plated on the hole wall.

Yet another aspect of the invention concerns a method of manufacturing printed wiring boards with plated-through holes capable of passing repetitive thermal stress tests. In this method, a base material is provided which has a coefficient of thermal expansion along the Z-axis which is no greater than the sum of the thermal expansion of copper and the percent elongation of the copper plated on the hole wall.

Another aspect of this invention is a method of manufacturing printed wiring boards with plated-through holes capable of passing repetitive thermal stress tests. This method comprises providing a base material and forming plated-through holes therein, the base material containing a polymeric resin, a woven fibrous reinforcement and a filler, the quantity of the filler being in inverse proportion to the percent elongation of the plating on the walls of the plated-through holes.

DETAILED DESCRIPTION OF THE INVENTION

The present invention relates to a woven fiber reinforced, plastic, base material and methods of using it in the manufacture of printed wiring boards. The plastic base material is characterized by a loading of inorganic filler which is sufficient to provide the base material with a coefficient of thermal expansion, CTE, in the Z-axis, at temperatures between 30° C. and 270° C., of less than 140 ppm, preferably less than 130 ppm and more preferably less than 100 ppm. When printed wiring boards having plated-through holes are formed on the base material of this invention, the plated-through holes are resistant to failure in thermal stress and thermal cycling.

According to this invention, the average CTE of the plastic base material is reduced by adding a reinforcing inorganic filler having a CTE of less than 20 ppm, and preferably less than 10 ppm. The amount of reinforcing filler added to the plastic base material is from 30 to 100 parts filler per 100 parts of the polymers in the base material, preferably from 40 to 80 parts filler per hundred parts of polymers. The filler should be thermally and chemically stable, electrically nonconductive and preferably non-hygroscopic and non-toxic. Non-toxic fillers are those having an eight hour time weighted average limit for human exposure greater than 1 $mg/m^3$. Preferably, fillers have a Moh hardness less than 7. Fillers having a Moh hardness greater than 7 are not useful in the practice of this invention because they cause excessive wear of drills and other tools used in the manufacture of printed wiring boards. Preferably the fillers will have a Moh hardness less than 5.

Suitable fillers include silicates such as calcium silicate (wollastonite), zirconium silicate, aluminum silicates, clays (feldspars, kaolin, micas, nepheline ($Na_3KAl_4Si_4O_{16}$), talc, zeolites), oxides such as titanium dioxide, silicas, glasses such as glass flour and glass spheres, and other fillers such as barium titanate mineral fibers, barite and anhydrite. Many other suitable fillers will be obvious to those skilled in the art.

Beryllia and asbestos fillers are not preferred because of their toxicity. Beryllia has an eight hour time weighted average limit for human exposure of 0.008 $mg/m^3$, and should be avoided. Quartz and alumina are very hard having Moh hardness between 7–8 and 8–9 respectively, and are not preferred because base materials containing these fillers are difficult to drill for plated-through holes. Hydrated aluminas such as gibbsite (also called aluminum hydroxide or alumina trihydrate) and boehmite (alumina dihydrate) are not preferred because they are thermally and chemically unstable, partially decomposing and releasing water below 300° C. Diaspore (alumina dihydrate) is thermally stable to soldering temperature and may be used. Alumina monohydrates and dihydrates are also not preferred because they tend to be hygroscopic. The moisture released by hygroscopic fillers and partial decomposition of fillers tends to increase the thermal expansion of the base material.

Surprisingly, it has been found that silicate fillers, especially kaolin and wollastonite, provide a superior surface on the hole wall for copper deposition.

The fillers may be dispersed into an impregnating varnish which is used to impregnate woven reinforcements with a polymeric resin. The impregnating varnish is a solution of thermosetting polymer precursors in solvents. Typical varnishes for impregnating glass cloth are epoxy resin solutions in acetone, methyl ethyl ketone or methyl ethyl ketone/acetone blends.

The particle size of the filler and particle size distribution are selected so that the filler particles are readily dispersed into the interstices of the woven glass reinforcement. The average particle size of the filler should be 0.1 micrometers to 25 micrometers, preferably from 0.3 micrometers to 15 micrometers and more preferably from 1 to 7 micrometers.

The control of the CTE along the Z-axis and the reinforcement obtained from a filler depend on the surface area of the reinforcing filler. The filler surface area should at least 150 sq. meters/100 grams of the solid resin composition (including filler), and preferably between 300 and 500 sq. meters/100 grams.

The glass cloth, woven aramid and woven quartz reinforcements ordinarily used in the manufacture of printed wiring board base materials are suitable for use in the base material of this invention. As in conventional printed wiring board base materials, the glass cloth is 45% to 65% by weight of the finished base material.

In the preparation of the impregnating varnish, the filler material is first wetted with solvent and then the resin solution is added to the wetted filler. Coupling agents may be added during the mixing of the varnish. According to a preferred embodiment of this invention, the filler is first wetted with coupling agents dissolved in the solvent. The solvent for the coupling agents may be the same solvent used to dissolve the impregnating resin and adjust the impregnating varnish viscosity. Acetone, methyl ethyl ketone or a mixture of acetone and methyl ethyl ketone are suitable.

The coupling agents are selected to improve the bonding between the constituents parts and also for stability. It has been found that printed wiring boards on base materials containing titanate or zirconate coupling agents are more resistant to thermal cycling failure than when silane coupling agents are used. It also has been found that silane coupling agents are attacked by alkaline solutions such as electroless copper deposition solutions more rapidly than organotitanate and organozirconate coupling agents. Since fully additive processing requires prolonged immersion in electroless copper deposition solutions, titanate and zirconate coupling agents are preferred in base materials for fully-additive printed wiring boards.

The insulation value of the base material between plated-through holes is reduced if copper plating on the hole walls intrudes into the base material by plating along the glass fibers. It now has been found that the intrusion of copper deposits from the hole walls into the base material along the glass fibers is substantially reduced when suitable titanate or zirconate coupling agents are used.

The coupling agent should not cause partial polymerization of the resin solution. For epoxy resin varnishes, the preferred coupling agents will not contain reactive amine groups.

The selection of the coupling agent will depend on the filler used. Suitable coupling agents are available from E. I. DuPont de Nemours and Co., Inc., Ajinomoto Co., Inc and Kenrich Petrochemicals Inc. Kenrich Petrochemicals Inc. of Bayonne, N.J., U.S.A. manufactures many suitable coupling agents. When wollastonite is used as the filler, suitable Kenrich coupling agents are KZ 55 TM (tetrakis[2,2-bis[(2-propenyloxy)methyl]-1-butanolato-O']-bis(ditridecyl-phosphito-O") dihydrogen zirconate), KR 55 TM (dihydrogen tetrakis[2,2-bis[(2-propenyloxy)-methyl]-1-butanolato-O']bis(ditri-decylphosphito-O") titanate), LICA 97 TM (tris(3-aminophenolato-[(2,2-bis[(2-propenyloxy)methyl]-1-butanolato-O',O"]titanium), KR 41B TM (tetraisopropyl-di(dioctylphosphito)titanate), or KR 46B TM (tetraoctyl-di(ditri-decylphosphito)titanate).

Suitable coupling agents for a zirconium silicate filler include KZ 55 TM and KZ TPP TM (cyclo[dineopentyl(diallyl)]pyrophosphato dineopentyl(diallyl) zirconate).

KZ 55 TM or LICA 12 TM (tris[bis(2-ethylhexyl)-phosphato-O"][2,2-bis[(2-propenyloxy)methyl]-1-butanolato-O,O',O"] titanium) are suitable coupling agents for kaolin fillers.

Suitable coupling agents for titanium dioxide fillers are KZ 55 TM or KR 134S TM (bis([4-(2-phenyl)propyl-2] phenolato, oxoethylenediolato titanium IV).

Suitable coupling agents for barium titanate fillers are KZ TPP TM, LICA 12 TM and LICA 38 TM (trihydrogen[P,P-bis (2-ethyl-hexyl)-diphosphato(2-)-O]bis[P,P-bis(2-ethylhexyl)-diphosphato(2-)-O',O"]-[2,2-bis[-(2-propenyloxy)-methyl]-1-butanolato-O1] titanate).

Low quartz silica fillers and nephaline feldspar fillers are used with KZ 55 TM or LICA 38 TM as coupling agents. A suitable coupling agent for fumed silica is KZ TPP TM.

A coupling agent that may be used with a calcined talc filler is KR 388 TM (isopropyltri(dioctyl)pyrophosphato titanate). Suitable coupling agents for powdered glass fillers include KZ TPP TM and KZ 55 TM, and for suzorite mica, KZ TPP TM, KZ 55 TM and LICA 12 TM, KZ 55 TM also may be used as a coupling agent with mineral fiber fillers.

The combination of a non-hygroscopic reinforcing filler and a suitable coupling agent surprisingly improves the insulation resistance and lowers the water absorption of the resulting base material. The thermal stress test excludes water absorption effects by a six hour oven dry before exposing the base material to molten solder at 288° C. In most production facilities, low water absorption is needed because such a long drying cycle is not feasible and water absorption by a printed circuit base material may cause stress failures during soldering of printed circuits.

The copper forming the walls of the plated-through hole must have certain minimum physical properties, elastic modulus, tensile strength, elastic limit or yield point and elongation in order to form a reliable plated-through hole which will not fail the IPC (The Institute for Interconnecting and Packaging Electronic Circuits) or MIL-P-55110D thermal stress tests. The physical properties required in the copper are related to the CTE of the base material. The copper deposited on the hole wall should have a tensile strength of at least 220 MPa.

The strain of the copper in the plated-through hole can be related to the CTE of the base material. Copper has a CTE of 16.2 ppm, and will expand 0.39% between 30° C. and 270° C. Therefore, the copper comprising the walls of a plated-through hole will expand at least 0.4% in a thermal stress test. The stress of the thermal expansion of the base material comprising the hole walls causes a copper strain. The excess of the copper strain over the thermal expansion of the copper will depend on the CTE of the base material in the Z-axis as follows:

TABLE 1

| CTE in Z-axis 30-270° C. ppm | Base Material Expansion Percent | Differential Thermal Expansion of Base Material and Cu - % |
|---|---|---|
| 60 | 1.4 | 1 |
| 100 | 2.4 | 2 |
| 140 | 3.4 | 3 |
| 185 | 4.4 | 4 |
| 225 | 5.4 | 5 |
| 265 | 6.4 | 6 |
| 310 | 7.4 | 7 |
| 350 | 8.4 | 8 |

Based on the above table, it has been found that plated-through holes resistant to thermal stress and thermal cycling failure will require the copper elongation to fracture to be equal to or greater than the difference in the thermal expansion of the copper and the Z-axis thermal expansion of the base material.

It now has been found that the CTE in the Z-axis preferably should be controlled so that the thermal expansion of the base material in the Z-axis is equal to or less than the thermal expansion of copper plus the strain to the elastic limit of the copper deposited on the hole wall. If the thermal expansion of a copper deposit at temperatures from 30° C. to 270° C. is 0.4% and the elastic limit is 2%, then, as shown in Table 1, the base material provided must have a Z-axis CTE of 100 ppm. The base material is produced with the required CTE along the Z-axis by admixing sufficient filler into the polymeric resin varnish.

It also has been discovered that reliable plated-through holes resistant to failure in thermal stress and thermal cycling can be produced if the percent elongation of the copper deposit and the average CTE along the Z-axis at temperatures from 30° C. to 270° C. can be controlled according to the following table:

TABLE 2

| Copper Deposit Percent Elongation | Base Material Average Z-Axis CTE 30-270° C. |
|---|---|
| 2 ± 1 | 95 |
| 3 ± 1 | 100 |
| 4 ± 1 | 105 |
| 5 ± 1 | 110 |
| 6 ± 1 | 115 |
| 7 ± 1 | 120 |
| 8 ± 1 | 125 |
| 9 ± 1 | 130 |
| 10 ± 1 | 135 |
| 11 ± 1 | 140 |
| 12 ± 1 | 150 |
| 13 ± 1 | 160 |
| 14 ± 1 | 170 |
| 15 ± 1 | 180 |
| 16 ± 1 | 190 |
| 17 ± 1 | 200 |
| 18 ± 1 | 210 |
| 19 ± 1 | 220 |
| 20 ± 1 | 230 |

It now has been found that the CTE along the Z-axis of the base material may be adjusted by the addition of filler to the resin varnish before impregnating the glass cloth. In order to provide thermal stress resistant, plated-through holes according to the teachings of this invention, the amount of filler added and the required CTE along the Z-axis depends on the copper that will be deposited on the hole walls, and the elongation of the copper at temperatures from 30° C. to 270° C. The percent elongation should be determined on a copper test sample which is 0.038 mm thick or at least as thick as the copper to be deposited on the hole walls. While for most copper deposits elongation measured at room temperature is sufficient, for more precise work, the elongation actually should be measured at 270° C. The quantity of filler added also depends on the surface area of the filler. When the filler has a surface area of about 10 sq. meters/gram and standard laminating and plating practices are used, the relationship between percent elongation of the deposited copper and the filler content of a woven glass cloth reinforced base material with a $T_g$ of 125±15° C. is illustrated in the table below:

TABLE 3

| Minimum Elongation of Copper Percent | Filler Loading phr | Maximum Z-axis CTE ppm | Average Z-axis CTE ppm |
|---|---|---|---|
| 2 | 105 | 110 | 100 |
| 3 | 100 | 118 | 105 |
| 4 | 85 | 128 | 110 |
| 5 | 80 | 134 | 115 |
| 6 | 75 | 142 | 120 |
| 7 | 75 | 150 | 125 |

Following the table, if the measured percent elongation of the copper deposits varies between 3% and 5%, the base material should be prepared with 85 parts of filler per hundred parts of polymer solids. This would provide a base material with filler surface area of 460 sq. meters/100 g of the resin/filler composition. The base material would have an average CTE along the Z-axis of 110 ppm and no lot above 128 ppm.

Surprisingly, it now has been found that with small particle size, high surface area fillers, it is possible to use filler loadings even lower than those levels shown in Table 3 as long as the filler surface area is 150 to 500 sq. meters/100 grams of the resin/filler composition.

The CTE's in Table 3 are those determined by Thermal Mechanical Analysis techniques; the percent elongation, as measured in accordance with the IPC Test Method 2.4.18, "Tensile Strength and Elongation Copper Foil". The percent elongation and the elastic limit of copper deposits vary directly with the thickness of the deposits, and should be determined on test foils of the same thickness as the copper to be deposited on the walls of the plated-through holes.

Since most base material producers have not regularly measured or controlled the CTE along the Z-axis by these criteria, it is obvious that as such criteria are installed, improvements in manufacturing techniques will lessen the currently observed variation in the CTE. Such improvements will permit reduction of the filler content and still provide a CTE along the Z-axis according to Table 2.

In epoxy glass laminates, the selection of the hardener or curing agent will depend on the resin system and whether the base material will be used in an additive or subtractive printed wiring board manufacturing procedure. It is well known that acid anhydrides are preferred for curing cycloaliphatic epoxy resins. For the more conventional bisphenol A epoxy resins, the preferred curing agent has been dicyandiamide when a copper clad base material is being prepared for printed wiring boards manufactured by a subtractive process because dicyandiamide cured bisphenol A epoxy resins have enhanced adhesion to copper foil compared to resins cured with alternative curing agents.

EXAMPLE 1

Copper foils, 35-40 micrometers thick, were electrolessly deposited from an electroless copper plating solution. The capability of the electroless plating solution was determined from the percent elongation of the copper foils which ranged from 3.5 to 7.8% with an average of 6.1%.

Referring to Table 2, it can be seen that for the production of fully-additive printed wiring boards using the electroless copper solution, a CTE along the Z-axis of 100 to 120 ppm was required. To lower the expansion along the Z-axis, 40 parts of filler per hundred parts of resin were added to the base material. The formulation was:

| | |
|---|---|
| DER 531 TM (Dow Chemical Co.)* | 90 kg (112 kg liquid) |
| DER 331 TM (Bisphenol A diglycidal ether resin available from Dow Chemical Co.) | 10 kg |
| Dicyandiamide (dissolved in DMF) | 3 phr |
| 2-methylimidazole | 0.07 phr |
| Filler, wollastonite (average particle size 10 micrometers surface area 10 sq. meters/gram) | 40 phr |
| Filler, catalytic (0.1% palladium on a kaolin support)** | 12.5 phr |
| KZ 55 TM coupling agent (available from Kenrich Petrochemicals)*** | 1 phr |
| KR 134S TM coupling agent (from Kenrich)**** | 0.2 phr |

*DER 531 TM is a solution of epoxy resins with 80% resin solids, and 19-20% bromine.
**U.S. Pat. No. 3,600,330.
***KZ 55 TM is dihydrogen tetrakis[2,2-bis[(2-propenyloxy)methyl]-1-butanolato-O']bis(ditridecyl phosphito-O") zirconate.
****KR 134S TM is bis[4-(2-phenyl)propyl-2]phenolato, oxoethylenediolato titanium IV.

To manufacture the base material, the coupling agents first were dissolved in a mixture of methyl ethyl ketone and acetone. The filler was dispersed in the coupling agent solution and mixed overnight to thoroughly wet the filler with the coupling agents. The filler and coupling agent solution then were added to a solution of the resins in a mixture of methyl ethyl ketone and acetone to make the impregnating varnish. The surface area of filler was 330 sq. meters/100 grams of the resin/filler composition.

In a conventional manner, woven glass cloth was impregnated with the varnish to make a prepreg, and 9 sheets of the prepreg were laminated together to form base material 1.5 mm thick.

The glass transition temperature, $T_g$ of the base material was 123° C. and the CTE along the Z-axis between 30 and 270° C. was 146 ppm. Conventional base material for the fully-additive process, which contains only the 12.5 phr catalytic filler, has a CTE along the Z-axis which averages 220 ppm.

Fully-additive printed wiring boards were formed on the base material by standard procedures. The "take time", the elapsed time before the initial copper deposit could be observed on the hole walls, was one fourth the "take time" of conventional base material.

The printed wiring boards were thermal stress tested on molten solder at 288° C. The experimental boards passed one thermal stress test with no cracks in the hole walls, but had partial cracks in 20% of the holes after four thermal stress cycles. Controls, printed wiring boards on conventional fully-additive base material with a Z-axis CTE of 220 ppm, failed the thermal stress test with cracks in 80% of the holes after four thermal stress cycles. This demonstrates that when the copper deposit had a minimum of 3.5% elongation, a Z-axis CTE of 142 ppm is slightly too high and a Z-axis CTE of 220 is much too high.

EXAMPLE 2

A varnish is prepared as in Example 1 except the wollastonite filler is increased to 60 parts filler per hundred parts resin. Prepreg is prepared by impregnating type 7628 woven glass cloth with the varnish. Four layers of prepreg plus outer layers of copper foil are laminated together. The outer layers of copper foil are printed and etched to form conductive layers corresponding to a ground plane and a voltage plane. Two additional layers of prepreg plus a layer of copper foil are laminated over both the ground plane and the voltage plane. The CTE of the finished laminate along the Z-axis from 30° to 270° C. is less than $140 \times 10^{-6}$/°C. A multilayer printed wiring board is formed from the laminate with plated-through holes resistant to failure by thermal stress and thermal cycling.

EXAMPLE 3

Example 1 was repeated except that a phenolic resin having at least three aromatic hydroxyl groups was used as the curing agent instead of dicyandiamide, and the filler loading was increased. The formulation was:

| | |
|---|---|
| DER 531 TM | 90 parts |
| DER 331 TM | 10 parts |
| HRJ2901 TM (phenolic resin available from Schenectady Chemicals Inc.) | 28 parts |
| Filler, wollastonite | 70 phr |
| Filler, kaolin with 0.1% Pd* | 8 phr |
| KZ 55 TM coupling agent | 1 phr |
| KR 134S TM coupling agent | 0.2 phr |

*U.S. Pat. No. 4,287,253.

The resulting base material had a $T_g$ of 115° C. and a CTE along the Z-axis from 30-270° C. of 82 ppm. The surface area of filler was 435 sq. meters/100 grams of the solid resin filler composition. Fully-additive printed wiring boards were prepared on the base material. The "take time" for initiation of the copper deposit was 50% less than in Example 1.

The printed wiring boards were thermal stress tested and passed five consecutive thermal stress tests with no cracks in the copper plating on the hole walls.

EXAMPLE 4

A base material was laminated using prepreg impregnated with a resin composition containing a high surface area filler. The surface area of the filler was 150 sq. meters/100 grams of the resin/filler composition.

The prepregs were prepared by the procedure of Example 1 using the following formulation:

| | |
|---|---|
| DER 531 TM | 90 parts |
| DER 331 TM | 10 parts |
| Dicyandiamide | 3 phr |
| 2-methylimidazole | 0.07 phr |
| Filler, catalyzed 0.1 Pd* | 12.5 phr |
| KZ 55 TM coupling agent | 1 phr |
| KR 134S TM coupling agent | 0.2 phr |

*The catalyzed filler was prepared according to U.S. Pat. No. 4,287,253, and the kaolin support had an average particle size of 0.6 micrometers and a surface area of 15-20 sq. meters/gram.

The prepregs were laminated by standard procedures to form a base material 1.5 mm thick. The base material had a Z-axis CTE from 30–270° C. of 120–125 ppm. Fully-additive printed wiring boards formed on the base material passed four cycles of the thermal stress test with no indications of cracks in the copper walls of the plated-through holes.

EXAMPLE 5

Following the procedures of Example 1, a base material was prepared with the following formulation:

| | | |
|---|---|---|
| DER 531 TM | 92 | kg |
| | (73.6 | kg solids) |
| Epoxy Resin XB 4383 TM | 25 | kg |
| (Ciba-Geigy Corp.)* | (18.75 | kg solids) |
| Cresol novolac epoxy resin | 8 | kg |
| Dicyandiamide | 3 | phr |
| 2-methylimidazole | 0.08 | phr |
| Filler, wollastonite | 70 | phr |
| Filler, kaolin with 1% Pd** | 12.5 | phr |
| KZ 55 TM coupling agent | 1 | phr |
| KR 134S TM coupling agent | 0.2 | phr |

*XB 4383 TM is a solution containing 75% of a brominated bisphenol A epoxy resin.
**U.S. Pat. No. 3,600,330.

The resulting base material exhibited a $T_g$ of 137° C. and a CTE along the Z-axis from 30–270° C. of 120 ppm. Fully-additive printed wiring boards prepared on this base material passed 5 cycles of the thermal stress test without cracks.

An additional lot of base material was prepared using the same formulation. This lot of base material had a $T_g$ of 129° C. and a CTE along the Z-axis from 30–270° C. of only 92 ppm.

Using standard, fully-additive process procedures, printed wiring boards were formed on the base material, the printed wiring boards having plated through holes with copper plating 36 to 40 micrometers thick. The electroless copper plating solution deposited copper which had an elastic limit of 1.8% at 36 to 40 micrometers thickness.

The printed wiring boards were thermal stress tested by four cycles on molten solder at 288° C. All the boards passed with no cracks in the holes.

A sample of the base material was dried at 140° C., weighed, immersed in water at 82° C. for 17 hours and reweighed to determine the water absorbed at 82° C A conventional additive base material was used as a control. The water absorption was 0.20% and the water absorption of the control was 0.36%. The filler in the control additive base material was 12 phr catalyzed clay, and it did not contain the titanate and zirconate coupling agents to enhance water resistance of the base material.

EXAMPLE 6

A printed wiring base material 1.5 mm thick was prepared using the following formulation which has a phenolic resin with aromatic hydroxyl groups as the curing agent:

| | | |
|---|---|---|
| Dow 531 TM epoxy resin | 100 | parts |
| HRJ 1152 TM (phenolic resin available from Schenectady Chemicals Inc.) | 28 | parts |
| 2-methylimidazole | 0.02 | phr |
| Filler, wollastonite | 70 | phr |
| Filler, kaolin with 0.1% Pd* | 12.5 | phr |
| KZ 55 TM coupling agent | 1 | phr |
| KR 134S TM coupling agent | 0.2 | phr |

*U.S. Pat. No. 3,600,330

The base material had a $T_g$ of 102° C. and a CTE along the Z-axis of 134 ppm.

Fully-additive printed wiring boards formed on the base material were plated in an electroless copper solution which formed deposits with 4–7% elongation at 36–40 micrometers thickness. The "take time" for this base material in the electroless plating solution was one-eighth as long as conventional fully-additive base materials which are cured with dicyandiamide and have as filler only 12.5% kaolin with 0.1% palladium. This demonstrates the improved catalytic activity for electroless plating of base materials having silicate fillers and a stoichiometric excess of phenolic hydroxyl groups.

EXAMPLE 7

A prepreg was prepared with the following formulation:

| | | |
|---|---|---|
| Quatrex 5010 TM (resin solids)* | 100 | parts |
| Filler, wollastonite | 40 | phr |
| Filler, kaolin with 0.1% Pd** | 10 | phr |
| KZ 55 TM coupling agent | 1 | phr |
| KR 134S TM coupling agent | 0.2 | phr |

*Quatrex 5010 TM is a one-component epoxy resin system containing a non-dicyandiamide hardener which is designated as a high $T_g$ system for printed wiring board base materials. It is believed to be a tris(hydroxyphenyl)methane triglycidyl ether resin, and a hardener which is the product of a solution of hexa(methoxymethyl)-melamine and bisphenol A reacted together at 145° C. in the presence of an oxalic acid catalyst.
**U.S. Pat. No. 3,600,330.

Nine sheets of the prepreg were laminated together to form a base material 1.5 mm thick which had a $T_g$ of 150° C. and a CTE along the Z-axis from 30° to 270° C. of 132 ppm.

Fully-additive printed wiring boards were formed on the base material and cycled four times through the thermal stress test. All the boards passed the tests with no cracks observed in the metal on the hole walls.

EXAMPLE 8

A laminate was prepared using nine sheets of prepreg impregnated with the following varnish:

| | | |
|---|---|---|
| Dow 41-1 TM Epoxy resin solution* | 125 | kg |
| | (1 | kg solids) |
| Kaolin** | 64 | kg |
| Catalyzed filler with 0.1% Pd*** | 6 | kg |
| Coupling Agent (KZ-55 TM) | 1 | kg |
| Coupling Agent (KR-134S TM) | 70 | g |
| 2-Methylimidazole | 0.45 | kg |
| Acetone | 80 | kg |

*A mixture of 200 g phenolic hardener, XU 71817 TM, and 800 g epoxy resin, DER 383 TM, from Dow Chemical Company as an 80% solids solution in acetone.
**Average particle size 1.5 micrometers.
***The catalytic filler was prepared according to U.S. Pat. No. 4,287,253, and the kaolin support had an average particle size of 0.6 micrometers and a surface area of 15–20 sq. meters/gram.

The laminate had a glass transition temperature, $T_g$, of 125° C. and an average coefficient of thermal expansion from 30° C. to 270° C. of $74 \times 10^{-6}$/°C.

What is claimed is:

1. In a method of manufacturing a printed wiring boardbase material consisting essentially of a multiplicity of layers of woven cloth impregnated with a thermosetting polymeric resin varnish and optionally including one or more internal conductive pattern layers, the improvement for providing a base material matched to a copper deposition solution to be used in the manufacture of the printed wiring comprising:

a. depositing a sample of said copper from the deposition solution, the sample having substantially uniform thickness, and being at least as thick as copper deposits to be used in the manufacture of the printed wiring board;

b. preparing test specimens from the sample, marking a gauge length on the test specimen, placing the test specimen in a tensile testing machine, applying a strain at a uniform rate until the test specimen breaks, and determining the percent elongation of the specimen at fracture;

c. determining the sum of the percent elongation at fracture and the coefficient of thermal expansion of copper from 30° C. to 270° C.;

d. providing the thermosetting resin varnish with an inorganic filler in an amount which is sufficient to provide the base material with an average coefficient of thermal expansion along its Z-axis between 30° C. and 270° C. which is equal to or less than the sum of the percent elongation and the thermal expansion of copper;

e. forming prepregs by impregnating the woven cloth with the varnish; and f. forming said base material by laminating the multiplicity of prepregs together.

2. A method according to claim 1 wherein the filler is present in an amount between 30 and 100 parts per hundred parts of the polymeric resin.

3. A method according to claim 1 wherein the filler is present in an amount sufficient to provide a surface area of filler in the base material between 150 and 500 sq. meters/100 grams of polymeric resin and filler.

4. A method of manufacturing a base material said base material being suitable for printed wiring board manufacture, the method comprising the steps of:

providing a copper deposition solution and forming a sample copper deposit 35-50 micrometers thick from the solution;

determining the percent elongation of the sample copper deposit and the average coefficient of thermal expansion from 30° C. to 270° C. of said copper;

preparing a woven cloth impregnated with a thermosetting resin varnish, the varnish containing an inorganic filler which is present in an amount sufficient to provide the base material with said average coefficient of thermal expansion plus the maximum elongation at 270° C. of said copper deposit; and laminating a multiplicity of layers of the impregnated cloth together to form said base material.

5. A method according to claim 4 wherein the filler is present in an amount between 30 and 100 parts per hundred parts of the polymeric resin.

6. A method according to claim 4 wherein the filler is present in an amount sufficient to provide a surface area of filler in the base material between 150 and 500 sq. meters/100 grams of polymeric resin and filler.

7. A method according to claim 5 where the filler is selected from the group consisting of calcium silicate, zirconium silicate and kaolin.

8. In a method of manufacturing a printed wiring board having at least one plated-through hole, the improvement comprising:

a) determining the strain to the elastic limit of the copper to be deposited in the plated-through hole;

b) providing a base material for the printed wiring board, the base material including a polymeric resin, a fibrous reinforcement, and a filler for the polymeric resin, the polymeric resin having a thermal expansion from 20° C. to 300° C. greater than the thermal expansion of said copper, the filler having a thermal expansion from 20° C. to 300° C. less than the thermal expansion of said copper, and the filler being present in an amount sufficient to reduce the thermal expansion of the base material in the direction of the cylindrical axis of the plated-through hole to less than the sum of the thermal expansion of said copper between 20° C. and 300° C. and strain of the copper deposit to the elastic limit; the printed wiring boards being resistant to failure by thermal stress and thermal cycling.

9. A method according to claim 8 wherein the filler is present in an amount between 25 and 100 parts per hundred parts of the polymeric resin.

10. A method according to claim 8 wherein the filler is present in an amount sufficient to provide a surface area of filler in the base material between 150 and 500 meters$^2$/100 grams of polymeric resin and filler.

11. A method according to claim 1 wherein the filler is present in an amount sufficient to provide the base material with an average coefficient of thermal expansion along its Z-axis from 30° C. to 270° C. less than $140 \times 10^{-6}$/°C.

12. A method according to claim 4 wherein the filler is present in an amount sufficient to provide the base material with an average coefficient of thermal expansion along its Z-axis from 30° C. to 270° C. less than $140 \times 10^{-6}$/°C.

13. A method according to claim 8 wherein the filler is present in an amount sufficient to provide the base material with an average coefficient of thermal expansion along its Z-axis from 30° C. to 270° C. less than $140 \times 10^{-6}$/°C.

* * * * *